Aug. 18, 1970 J. D. HARNDEN, JR 3,524,986

SEMICONDUCTOR LIGHT GATING OF LIGHT ACTIVATED SEMICONDUCTOR POWER CONTROL CIRCUITS

Filed Feb. 6, 1967 9 Sheets-Sheet 1

Inventor:
John D. Harnden, Jr.
by Paul A. Frank
His Attorney.

Inventor:
John D. Harnden, Jr.
by Paul A. Frank
His Attorney.

Inventor:
John D. Harnden, Jr.
by Paul A. Frank
His Attorney.

Inventor:
John D. Harnden, Jr.
by Paul A. Frank
His Attorney.

Inventor:
John D. Harnden, Jr.
by Paul A. Frank
His Attorney.

Inventor:
John D. Harnden, Jr.
by Paul A. Frank
His Attorney.

Inventor:
John D. Harnden, Jr.
by Paul A. Frank
His Attorney.

Inventor:
John D. Harnden, Jr.
by Paul A. Frank
His Attorney.

Inventor:
John D. Harnden, Jr.
by Paul A. Frank
His Attorney.

3,524,986

SEMICONDUCTOR LIGHT GATING OF LIGHT ACTIVATED SEMICONDUCTOR POWER CONTROL CIRCUITS

John D. Harnden, Jr., Schenectady, N.Y., assignor to General Electric Company, a corporation of New York Filed Feb. 6, 1967, Ser. No. 614,076
Int. Cl. G02f 1/28; H01j 39/12; H03k 3/42
U.S. Cl. 250—211 8 Claims

ABSTRACT OF THE DISCLOSURE

Light activated semiconductor control circuits are described which use variably controlled, low voltage, injection electroluminescent p-n junction light emitting diodes to control larger, power rated, light activated semiconductor devices such as light activated silicon controlled rectifiers connected in a variety of power circuit configurations. By reason of this construction, isolation between the low voltage, control gating signals (supplied to the light emitting diodes) and the larger power rated current flowing in the circuits, is inherently provided by the fundamental difference in the physical nature of the light signals employed for gating and the electric power currents derived at the output from the circuits.

This invention relates to new and improved, light activated, semiconductor, power control circuits.

More particularly, the invention relates to light activated semiconductor, power control circuits employing low voltage, injection and electroluminescent p-n junction, light emitting diodes as gating signal sources to control light acitvated power semiconductors, such as light activated four and five layer devices such as the LASCR, light activated, bilateral semiconductor triodes known as triacs, light activated switching power transistors, and the like, to thereby control electrical power supplied to an electrical load by the circuits.

It has long been recognized that certain semiconductor electric power switching devices such as the silicon controlled rectifier, are susceptible to being triggered from their nonconducting, current blocking condition to their conducting, current carrying condition by means of light. The General Electric Company, for example, manufactures and sells light activated silicon controlled rectifiers described in chapter 11 of "The Silicon Controlled Rectifier Manual," third edition—published by the Semiconductor Products Department of the General Electric Company—Syracuse, N.Y. Such devices have inherent freedom from undesired cross channel switching and transient noise pulse switching associated with conventional, electrically gated on SCR's, etc. This inherent freedom from undesired switching stems from the fundamental difference in the physical nature of the light rays employed to gate-on the light activated devices; and the electrical current employed to turn on electrically gated devices. This characteristic makes the light activated semiconductor devices quite useful in certain applications where the provision of isolation between the low voltage signal level control circuits and the larger power rated portions of the circuit otherwise would greatly complicate construction of the circuits. By employing light activated semiconductor devices in conjunction with injection and electroluminescent p-n junction, light emitting diode devices, many of the isolation problems heretofore encountered can be successfully overcome.

It is therefore a primary object of the present invention to provide a family of new and improved light activated, semiconductor power control circuits using low voltage injection and electroluminescent p-n junction light emitting diodes to control larger, power rated, light activated semiconductor devices connected in a variety of power circuit configurations. By reason of this construction, isolation between the low voltage gating signals and the larger power rated currents flowing in the circuit is inherently provided by the fundamental difference in the physical nature of the light signals and the electric power current.

In practicing the invention, a light activated power semiconductor circuit includes the combination of two or more light activated semiconductors of the type having a light sensitive junction for triggering the device into conduction, the light activated semiconductors having different light response characteristics and being connected in a power circuit configuration. One or more injection electroluminescent p-n junction devices are provided for emitting light within different characteristic portions of the visible and invisible optical spectrum. The emitted light within each characteristic portion of the spectrum is directed onto the light sensitive junction of at least one of the light activated semiconductors. The light response characteristic of each light activated semiconductor is matched to the emitted light directed onto its light sensitive junction so as to be responsive thereto to be triggered into conduction and to be substantially non-responsive to emitted light within other characteristic portions of the spectrum. To complete the circuit, variable control means are provided for controlling the light emitted by at least one of said injection electroluminescent p-n junction devices for controlling turn-on of the light activated semiconductors. In preferred embodiments of the invention the light activated semiconductor comprises a light activated silicon controlled rectifier having an enabling potential supplied across its load terminals simultaneously with the application of gating-on light pulses thereto. It is also preferred that the means for directing light from the light emitting diode comprise a bundle of fiber optic elements which are properly shaped to optimize the intensity of the light transmitted from the light emitting diode to the light activated semiconductor. The control means preferably comprises a variable pulsing network having the injection electroluminescent p-n junction, light emitting diode coupled across its output for supplying electrical energizing pulses to the light emitting diode at a variable rate proportional to a desired electric power output from the overall power control circuit. A variety of power circuit configurations each possessing certain of these features are described. In one embodiment, a plurality of highly sensitive light activated semiconductors are connected in series between a pair of high voltage power supply terminals with a second injection electroluminescent p-n junction device for gating a second string of parallel-connected less sensitive light activated semiconductors.

Other objects, features and many of the attendant advantages of this invention will be appreciated more readily as the same becomes better understood by reference to the following detailed description, when considered in connection with the accompanying drawings, wherein like parts in each of the several figures are identified by the same reference character, and wherein:

FIGS. 1(a) to 1(c) is a schematic circuit diagram of an alternating current, light activated semiconductor, proportional power control circuit constructed in accordance with the invention;

FIGS. 2(a) and 2(b) is a schematic circuit diagram of a light activated, combined single phase inverter circuit and/or reversing control operated from a high voltage direct current power supply and constructed in accordance with the invention;

FIGS. 3(a) and 3(b) is a circuit diagram of a modified form of the circuit shown in FIG. 2;

FIG. 4 is a schematic circuit diagram of still another modification of a combined direct current reversing control and/or inverter circuit employing light activated elements according to the invention;

FIGS. 5(a) and 5(b) is a schematic circuit diagram of still another form of direct current reversing control and/or inverter circuit employing light activated transistors in accordance with the present invention;

FIGS. 6(a) and 6(b) is a schematic circuit diagram of still another form of alternating current proportional control power circuit using light activated power switching elements and a proportionally controlled triac triggering a light emitting diode for gating on the light activated power switching elements of the circuit;

FIG. 7 is a schematic circuit diagram of a power circuit configuration for use with very high voltage sources and employing stacked series arrays of light activated power switching elements together with a slaved light triggering diode arrangement;

FIGS. 8(a) and 8(b) is a schematic circuit diagram of a time ratio control power circuit utilizing light activated elements for both turn on and commutation off of the power switching elements of the circuit;

Figure 1C:
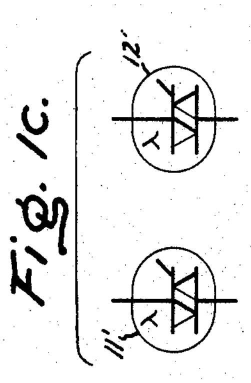
Figure 1B:
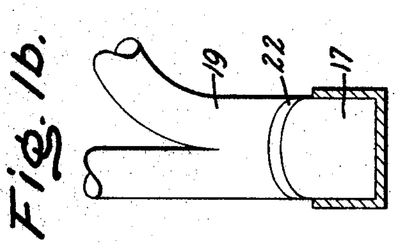
Figure 1A:
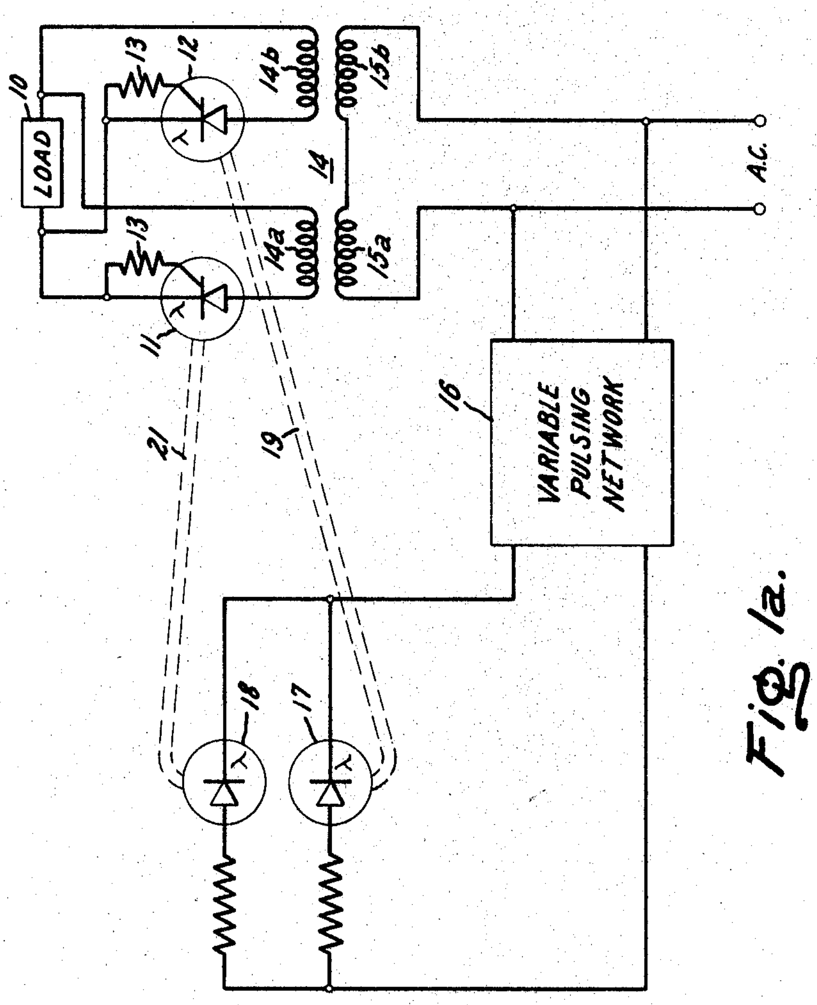

FIGS. 1(a) to 1(c) is a schematic circuit diagram of an alternating current, proportional control power circuit constructed in accordance with the invention. The power circuit shown in FIGS. 1(a) to 1(c) is comprised by a pair of light activated, gate controlled semiconductors 11 and 12.

The light activated gate controlled semiconductors preferably comprise gate controlled, light activated silicon controlled rectifiers (hereinafter referred to as LASCR's) of the type illustrated and described in chapter 11 of the "Silicon Controlled Rectifier Manual," third edition, published by the Semiconductor Products Department of the General Electric Company, Syracuse, N.Y. It should be understood that the invention is not to be limited to use with light activated silicon controlled rectifiers but could employ other light activated control elements such as a light activated transistor, a light activated triac (bilateral semi-conductor triode) a photoconductor, photoresistor, a two terminal p-n-p-n light activated switch such as that described in chapter 18 of the textbook entitled "Static Relays for Electronic Circuits" by R. F. Blake, published by Engineering Publishers of Elizabeth, N.J., Library of Congress Catalogue Card No. 60–12808, solar cells, etc.

The light activated silicon control rectifiers, in fact, are small silicon controlled rectifiers provided with a glass window to permit triggering by means of light as well as by the application of a normal gate signal to its control gate electrode. These units are commercially available in voltage ratings from 25 volts to 200 volts and up, and differ generally from each other only in the amount of incident radiant energy (light) required to initiate switching. Thus, the devices comprise high speed power switches which can actuate directly solenoids, contactors, motors, lamps, etc. and because they are triggered by an incident light beam, they provide complete electrical isolation between the electrical power output and the control light input of the devices. Thus, the LASCR has many advantages over other types of p-n-p-n switches. Operation and circuit handling of the LASCR is similar to the conventional, electrically gated SCR with the exception that an external resistance 13 is connected between the control gate electrode and cathode of the LASCR, and (in addition to bias voltage and current) determines the light sensitivity of the device since the gate-current caused by incident light originates within the silicon pellet of the device. An additional advantage is provided in that the fast light pulses used for turn on, such as those obtained from an LED, either coherent or noncoherent, provide faster more complete turn on action than occurs with electrical gate triggering. It is more like anode or so-called *dv/dt* firing, wherein broader, multiple areas of the junction are turned on.

With normally applied voltage across its load terminals, the LASCR, which is a three junction p-n-p-n device, has its first and third junctions forward biased so that they can conduct if free charge carriers are present. However, the second or middle junction is reverse biased and normally blocks current flow. Light entering through the window provided in the casing of the LASCR impinges on the silicon pellet and creates free hole-and-electron pairs in the vicinity of the second or middle junction. These free hole-and-electron pairs are swept across all of the junctions of the device to produce a small current from anode to cathode. As the light increases, this current increases and the current gain of the n-p-n and the p-n-p transistor equivalents in the structure also increase. At some point the net current gain exceeds unity and current will increase to a value that is limited only by the external circuit. When conducting current, the forward voltage drop of an LASCR is slightly more than the forward voltage drop of a conventional p-n junction rectifier. When in its nonconducting or current blocking condition the LASCR introduces a substantial impedance (almost infinite) to current flow.

LASCR's are commercially available which respond to a wide range of gating light signals having wavelengths extending over the complete visible spectrum into the ultraviolet region and having a peaked response in the infrared region. If at the same time such a gating light signal is directed against the light sensitive junction of the LASCR, it is supplied with an enabling potential applied across its load terminals, the device will break down and conduct current through it in much the same manner as a conventional SCR, but often with superior characteristics.

Referring again to FIGS. 1(*a*) to 1(*c*), the LASCR's 11 and 12 have their load terminals (or supply terminals) connected in series circuit relationship with the secondary winding portions **14*a* and 14*b* of a coupling transformer 14 across a load 10 in a manner such that the currents through the two LASCR's 11 and 12 are added in the load 10. The coupling transformer 14 has its primary windings 15*a* and 15*b* connected in series circuit relationship across a source of alternating current supply. The source of alternating current potential is also coupled across the input of a variable pulsing network 16 that may comprise a conventional, variable frequency square wave pulsing circuit for producing variable frequency, square wave gating-on potentials at its output terminals. The output of the variable pulsing network 16 is coupled across a pair of parallel connected, injection and electroluminescent p-n junction light emitting diode devices 17 and 18 through suitable current limiting resistors. By this arrangement the variable pulsing network 16 constitutes a control means for variably controlling the light pulses emitted by the injection and electroluminescent p-n junction light emitting diodes 17 and 18**.

The light emitting diodes 17 and 18 (hereinafter referred to as LED's) can convert electricity directly into light by a process known as junction injection electroluminescence. Such devices are manufactured and sold by a wide number of manufacturers, and are capable of emitting light whose peak intensity by appropriate manufacture can be located at any desired point in a wide spectrum extending over the visible and infrared region. For example, the General Electric Company manufactures and sells a p-n junction light emitting diode identified as LED–7 which is gallium phosphide device and emits visible light in the red region at about 7,000 angstroms at room temperatures. The gallium phosphide light emitting diode also happens to be double valued in the sense that if it is reversed biased with sufficient voltage, it will produce light in the visible green region somewhere in the vicinity of 5,000 angstrom units. General Electric also manufactures and sells gallium arsenide light emitting diodes identified as LED–9, 10 and 11 capable of emitting light in the infrared region at around 9,000 angstrom units at room temperature. These devices have a forward voltage drop of about 1.25 volts while carrying a direct current of about 100 milliamperes. For a further description of these devices reference is made to the General Electric Company Application Notes relating to LED's issued by the Semiconductor Products Department located at Electronics Park in Syracuse, N.Y. These application notes 55.14 and 55.13 are entitled "Visible Light Emitting Diodes LED–7" and "Infrared Light Emitting Diodes LED–9, LED–10, and LED–11," respectively. A variety of different types of such light emitting diodes are offered for sale by a wide number of manufacturers, including the above listed materials, as well as silicon carbide, which emits a blue-white light. It can be appreciated, therefore, that by appropriate choice of LED's a considerable selection of light emitting characteristics are available.

In order to assure that the light emitted by the LED's 17 and 18 will impinge on the light sensitive surface of the LASCR's 11 and 12, light pipe coupling means shown at 19 and 21, are provided. The light pipe coupling means may comprise small tubular members having internally reflecting surfaces but preferably comprise a bundle of fiber optic elements formed from glass fibers or light transmitting plastic fibers with suitably chosen light transmission properties. To further optimize coupling of the light emitted by the LED 17 or 18 to its associated LASCR, the fiber optic element 19 or 21 is secured over the light emitting surface of the LED in the manner shown in FIG. 1(*b*) of the drawings. As illustrated in FIG. 1(*b*) the light emitting surface of the LED, such as 17, is semi-spherically shaped, the coacting end of the bundle of fiber optic coupling elements 19 is complementarily shaped so as to be disposed over and enclose the semi-spherically shaped light emitting surface of the LED 17. The end of the bundle of light optic fibers 19 may be secured to the semi-spherically shaped light emitting surface of LED 17 by a suitable coupling medium shown at 22 and by clamping with mechanical means where the coupling medium has the same index of refraction as the bundle of fiber optic elements 19. It is also desirable that the light sensitive surfaces of the LASCR's 11 and 12 be similarly shaped and secured to the ends of the fiber optic elements 19 or 21 in the same manner.

In operation, the circuit of FIGS. 1(*a*) and 1(*c*) functions in the following manner. The alternating current supplied across the primary windings **15*a* and 15*b* of coupling transformer 14 periodically will enable the LASCR's 11 and 12 so that they can be rendered conductive over the half cycle of the AC supply potential while their anodes are biased positively. Thus, during each positive half cycle of the supply AC potential the LASCR's 11 and 12** are conditioned for conduction.

During the same positive half cycle mentioned above, the variable pulsing network 16, which comprises a conventional, variable frequency, pulse generator, applies pulsed driving potentials across each of the LED's 17 and 18. These pulsed driving potentials may have a fixed pulse duration and variable frequency or may have a fixed frequency or rate and variable pulse duration. During the positve going pulsed potentials, LED's 17 and 18 will be rendered conductive so as to produce light pulses at the p-n junction thereof in accordance with the well known junction injection electroluminescence phenomenon. These variably controlled light pulses are transmitted through the fiber optic coupling elements 19 and 21 to the light sensitive surfaces of the LASCR's 11 and 12. Since the LASCR's 11 and 12 have been enabled by the application of a positive potential to the anodes thereof, they are then rendered conductive and conduct load current through the load simultaneously until the next current zero of the AC supply. At this point, the LASCR's will be line commutated off in a conventional manner. It can be appreciated that by varying the point in the phase of each positive half cycle when the LED's 17 and 18 are activated to emit light pulses, the point in the phase of the supply AC wave where the LASCR's 11 and 12 are rendered conductive, can be proportionally controlled. In this manner, proportional control over the load current flow through the load 15 can be achieved.

If desired, the LASCR's 11 and 12 could be replaced with light activated semiconductor bilateral triodes (triacs), shown schematically in FIG. 1(c) of the drawings, to provide the same result. Alternatively, appropriate modification of the light emitting diode circuit through the addition of two additional LED's connected in the reverse direction together with an appropriate variable frequency square wave gating source and fiber optic coupling elements so as to supply gating on light pulses to the light sensitive surfaces of the light sensitive triacs 11′ and 12′, the circuit of FIG. 1 could be converted to a full wave proportional control circuit.

Figure 2A:
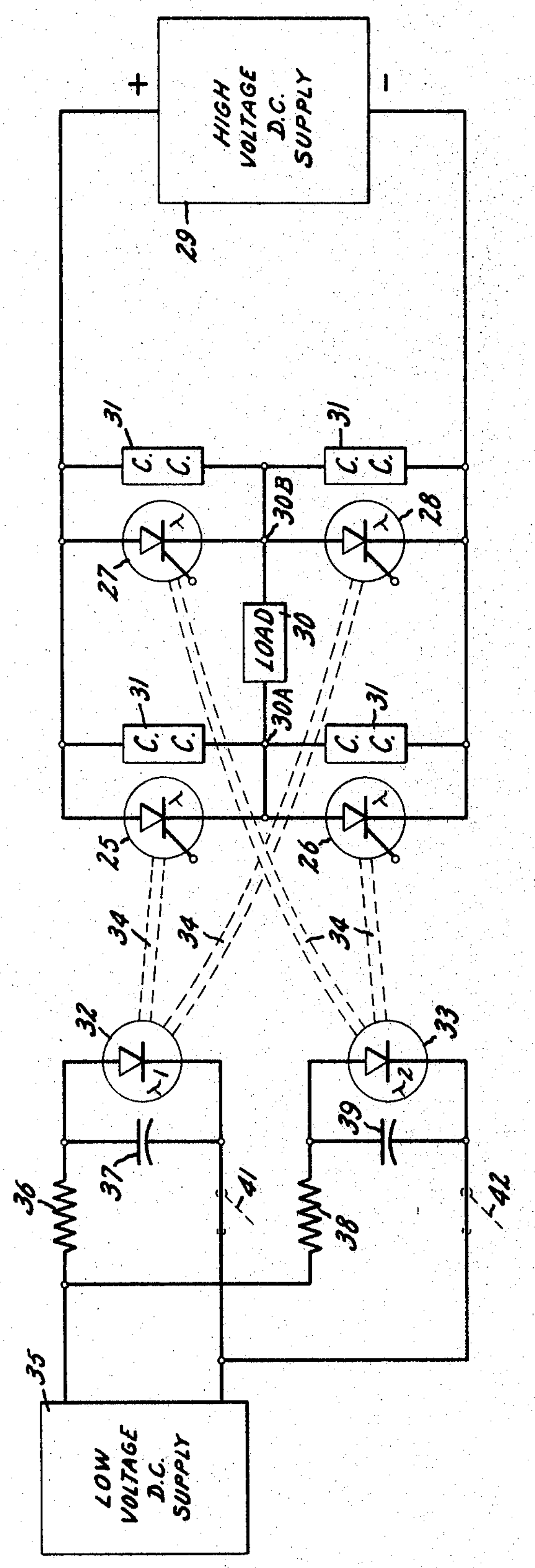
Figure 2B:
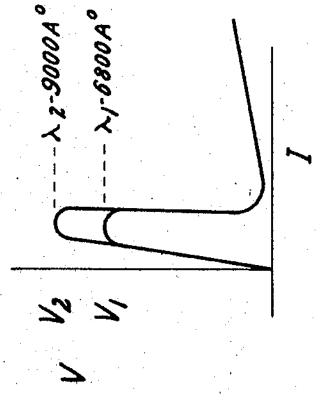

FIGS. 2(a) and 2(b) of the drawings illustrates a combined single phase inverter power circuit reversing direct curren tcontrol circuit constructed in accordance with the invention. When used as an inverter, the circuit converts a high voltage direct current into alternating current. The circuit shown in FIG. 2(a) can also be used as a reversing direct current control by appropriate adjustment of the circuit. In FIG. 2(a), two sets of two series connected LASCR's 25, 26 and 27, 28 are connected across the terminals of a high voltage direct current supply 29. A load 30 is connected between the juncture of the two LASCR's 25 and 26 and the juncture of the two LASCR's 27 and 28. Suitable commutating circuits of any convenient design shown at 31 are connected across each of the LASCR's 25 through 28 for commutating the LASCR's off after they have been rendered conductive.

The LASCR's 25 through 28 are triggered into conduction by light supplied from a pair of LED's 32 and 33. The light emitted by the LED's 32 and 33 may be transmitted to the LASCR's through suitable fiber optic coupling elements shown in dotted lines at 34, or alternatively, by judicious arrangement of the components of the circuit, direct light coupling may be employed with or without a suitable lens assembly. The LED's 32 and 33 are supplied from a low voltage, direct current supply 35 coupled to the LED 32 through a resistor-capacitor charging network 36, 37, and to the LED 33 through a similar network 38, 39. The two LED's 32 and 33 differ from each other in that they trigger at different voltage levels as indicated by the voltage-luminosity curve shown in FIG. 2(b) used for purposes of illustration, but not limited thereto. As indicated in FIG. 2(b), the LED 2 is rendered conductive at a voltage level $V_1$ and emits light at 6,800 angstrom units. In contrast, the LED 33 triggers at a voltage level $V_2$ and emits light at 9,000 angstrom units. The two resistor-capacitor networks 36 and 37, 38 and 39 are adjusted to supply the required voltage levels $V_2$ and $V_1$ after appropriate charging intervals for suitable inverter operation (if desired) or for operation as a reversing direct current control as described hereinafter. Additionally, it should be noted that the two LASCR's 25 and 28 to be triggered by LED 32 should be designed to be responsive to the spectral frequency emitted by LED 32, and similarly the two LASCR's 26 and 27 are designed to respond to the spectral frequency emitted by LED 33.

In operation, it will be appreciated that the LED 32 will be rendered conductive and emit light prior to the LED 33 in accordance with FIG. 2(b). Light emitted by LED 32 is transmitted to the light sensitive junctions of the LASCR's 25 and 28. Since the load terminals of these two LASCR's are continuously enabled from a high voltage DC supply 29, they are therefore rendered conductive, and serve to connect the load 30 to the high voltage DC supply 29 in a manner such that its terminal 30*a* is positive and its terminal 30*b* is negative. Thereafter, the commutating circuit 31 associated with each of the LASCR's 25 and 28 function to turn off these LASCR's. In the interim the LED 32 has discharged capacitor 37 and is no longer emitting light. Consequently, the LASCR's 25 and 28 reassume their nonconducting, current blocking condition. At some point in time thereafter, depending upon the parameters of the circuit, the voltage across capacitor 39 is sufficient to render the LED 33 conductive and to produce a light pulse that is transmitted to the light sensitive junctures of the LASCR's 26 and 27. As a consequence these two LASCR's are rendered conductive and serve to connect the load 30 across the high voltage DC supply 29 in a manner such that the terminal 30*b* is positive and the terminal 30*a* is negative. Thereafter the LASCR's 26 and 27 are commutated off by their associated commutating circuits 31 and upon discharge of capacitor 39 by LED 33 this LED turns off. It will be appreciated therefore that succeeding cycles of operation in the above described manner serve to develop an alternating current across the load terminals 30*a*, 30*b* of load 30. The frequency of this alternating current is, of course, determined by the parameters of the circuit, the commutating frequencies of the commutating circuit 31, etc. as is well known in ineverter circuit design.

It might also be noted that by the introduction of suitable selector switches, such as those shown in dotted outline form at 41 and 42, it is possible to convert the circuit shown in FIG. 2 into a reversible, direct current drive circuit. This would require appropriate redesign of the commutating circuit 31 to provide selective control over commutation in a manner to be described more fully hereinafter in connection with FIG. 9. The selector 41 or 42 may be either manually or automatically operated to provide reversible control of the current supplied to load 30 through the LASCR's 25 through 28.

Figure 3B:
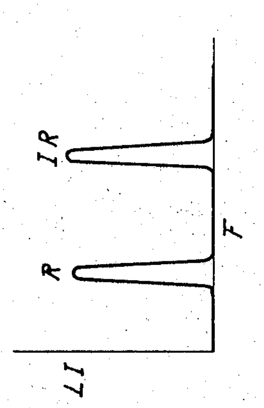
Figure 3A:
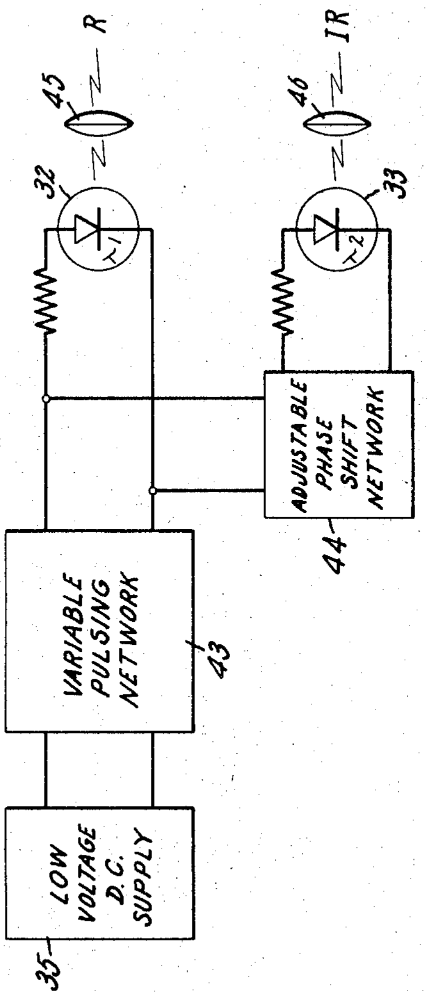

FIGS. 3(*a*) and 3(*b*) of the drawings are schematic circuit diagrams of a modified form of a light excitation circuit suitable for use with the single phase inverter-reversing DC control receptor circuit shown in FIG. 2. In the arrangement of FIG. 3 the two LED's 32 and 33 are excited from a low voltage direct current supply 35 through a variable pulsing network 433. The output of the variable pulsing network 43 is supplied through a limiting resistor across the LED 32, and is supplied through a phase shift network 44 and limiting resistor across LED 33. Phase shift network 44 is designed to introduce the required time delay between actuation of the SCR's 26 and 27 after LASCR's 25 and 28 have been commutated off, as described above. If desired, a suitable lens assembly such as shown at 45 and 46 may be inserted in place of the fiber optic coupling element 34 used with the system of FIG. 2 to optimize light coupling to the light sensitive junctions of the LASCR's 25 through 28. FIG. 3(*b*) of the drawings illustrates a plot of the light intensity versus spectral distribution of the light emitted by the two LED's 32 and 33. This curve corresponds to the curve shown in FIG. 2(*b*) but is a plot of the spectral distribution as opposed to the voltage distribution shown in FIG. 2(*b*). It should also be noted that the LED's 32 and 33 of FIGS. 2 and 3 may be designed to trigger at the same voltage level or at different voltage levels as shown in FIG. 2. If they trigger at the same voltage levels, then the R-C time constant of their associated resistor-capacitor control network must be adjusted to provide the desired timing sequence of their triggering. Also, the arrangement of FIGS. 3*a* and 3*b* is susceptible for use as a reversing control by appropriate inclusion of selector switches in the two branch circuit supplying LED's 32 and 33, and by appropriate design of the variable pulsing network to provide single output controlling pulses.

Figure 4:
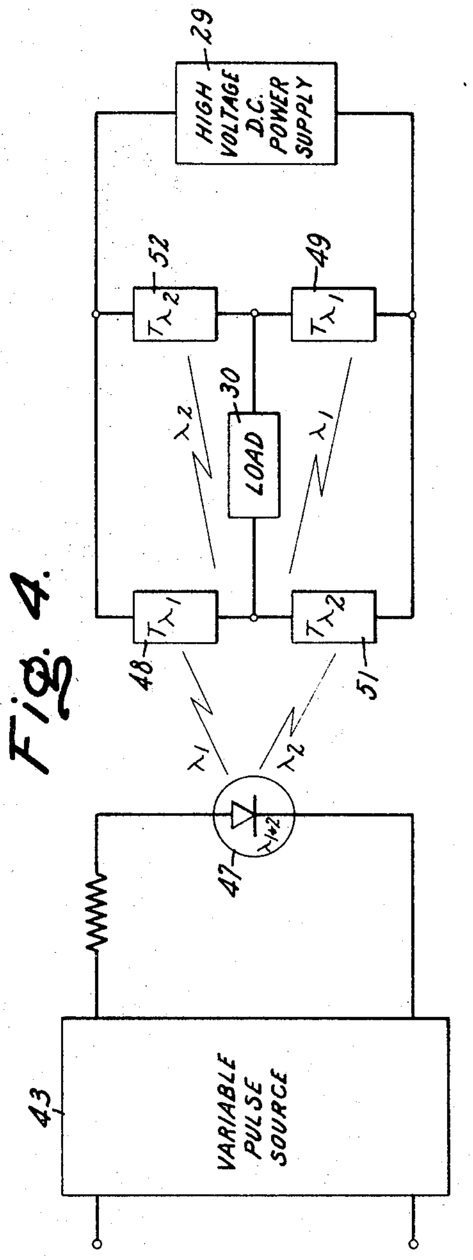

FIG. 4 of the drawings illustrates a modified form of a reversing power control circuit constructed in accordance with the invention wherein a single injection and electroluminescent p-n junction, light emitting diode 47 is employed to supply gating on light pulses at two different frequencies to the two separate arms of a reversing direct current drive circuit. The LED 47 comprises a gallium phosphide LED which is capable of emitting light at two different frequencies depending upon the polarity of the energizing potential applied across its load terminals. This device when energized with a potential in excess of its threshold potential in the forward direction, emits light having its spectral frequency centered in the red portion of the visible spectrum and when energized with a reverse polarity potential in excess of the reverse threshold potential, emits light centered in the green portion of the visible spectrum. For convenience of illustration, the red light has been identified as $\lambda_1$ and the green light is $\lambda_2$. The LED 47 is energized from a variable pulse source 43 through a suitable limiting resistor, and the light emitted by LED 47 is transmitted to suitable receptors 48, 49, 51 and 52 either directly or, if desired, through suitable light coupling transmission paths such as fiber optic bundles, lens assemblies, etc.

The light sensitive receptors 48 through 52 preferably comprise light activated silicon controlled rectifiers, light activated transistors, light activated triacs, or may comprise light sensitive elements such as photoresistors or photoconductors fabricated from compositions such as lead sulfide, lead telluride and lead selenide or cadmium sulfide, cadmium telluride, cadmium selenide, zinc sulfide, zinc telluride, zinc selenide, or any other of the known photoconductive compositions having the requisite properties listed below. In addition, photogenerators such as solar cells can be used to advantage. Such photoconductive compositions by appropriate fabrication can be designed to exhibit substantially infinite impedance in the absence of light, and upon the impingement of light thereon become highly conductive. By appropriate fabrication of the elements 48 and 49 in such a manner that they are responsive to the red light only and the elements 51 and 52 so that they are responsive to the green light only, it can be appreciated that a reversing control can be provided for supplying reversible direct current through the load 30 from a high voltage direct current power supply 29. If in place of the light sensitive elements 48 through 52, LASCR's having commutating circuits such as shown in FIG. 2 are employed, the circuit arrangement of FIG. 4 could be designed to operate as an inverter for supplying alternating current across the load 30 in much the same manner as previously described with relation to FIG. 2. If desired, the circuit of FIG. 4 could be employed as a cycloconverter circuit if it is provided with an alternating current power supply in place of the direct current source shown and the frequency of the A.C. power supply is made to be relatively high in comparison to the output frequency. Then, by proper operation of the circuit in accordance with well known cycloconverter operating principles, modified A.C. of a desired output frequency can be obtained from the circuit. Further, in place of making the light emitting diodes emit light in different characteristic portions of the spectrum, it is entirely possible to use a single light source in conjunction with a number of selected optical filters whose pass band characteristics are carefully chosen to correspond to the response characteristics of the light activated elements to be controlled.

Figure 5A:
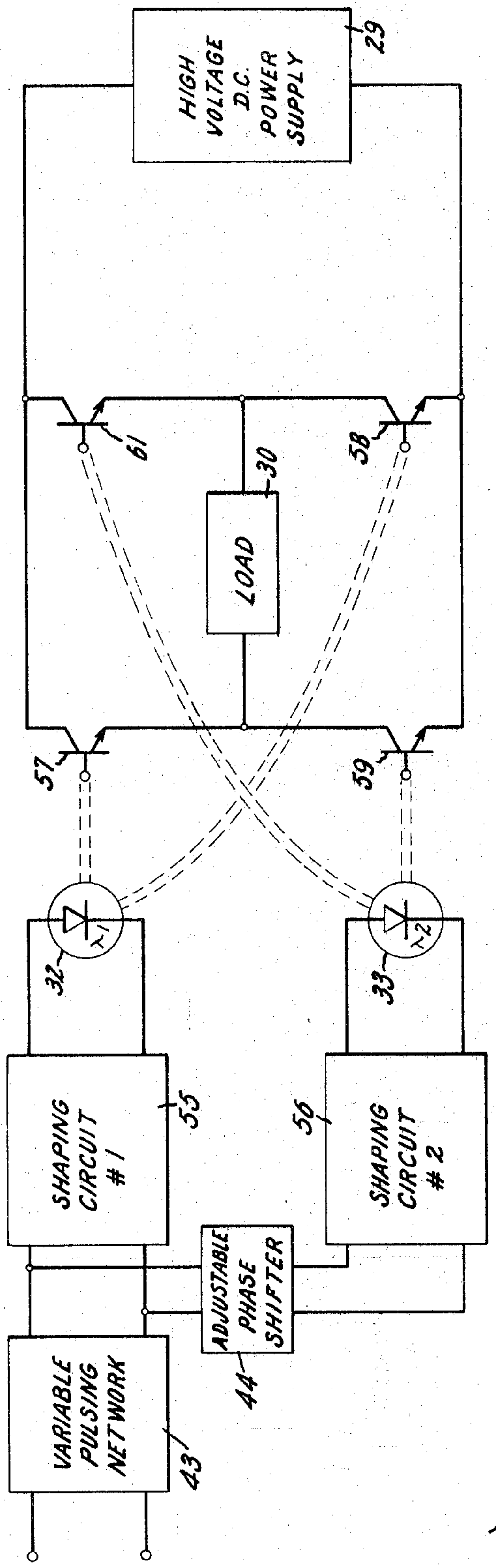
Figure 5B:
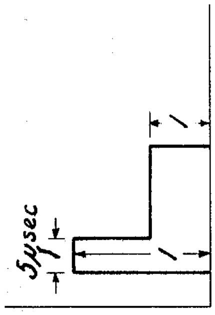

FIGS. 5(*a*) and 5(*b*) of the drawings illustrates a modified form of the circuit shown in FIG. 3 wherein each of the LED's 32 and 33 are supplied from suitable pulse shaping circuits 55 and 56. The pulse shaping circuit 55 has its input connected directly to the output of the variable pulsing network 43 and the pulse shaping circuit 56 has its input connected to the output of variable pulsing network 43 through an adjustable phase shifter circuit 44. Light emitted by the LED's 32 and 33 is supplied to the light sensitive junction of a pair of light sensitive transistors 57 and 58 or 59 and 61, respectively. The light sensitive transistors 57 through 61 are commercially available phototransistors manufactured by a number of semiconductor device fabricators such as the Texas Instrument Company of Dallas, Tex. The phototransistors 57–61 are operated in the switching mode and differ from the light activated SCR in that light must be maintained on the light sensitive surface of the device in order to maintain the device in its conducting condition. Otherwise, upon being rendered conductive the light sensitive transistors 57 and 58 serve to couple load 30 across the high voltage direct current power supply 29 in one direction, while the light sensitive transistors 59 and 61 couple load 30 for reverse current flow through the load.

In operation the circuit of FIGS. 5(*a*) and 5(*b*) are designed so that the light emitting diodes 32 and 33 maintain light supplied to the photosensitive surface of the light sensitive transistors 57 through 61 for predetermined periods after their turn-on, sufficient to provide a desired load current flow through load 30. For this reason the shaping circuits 55 and 56 are designed to shape the pulsed enabling potential supplied across the LED's 32 and 33 in the manner shown in FIG. 5(*b*) of the drawings. The leading edges of the shaped-pulses comprise a very sharp peak voltage wave front extending for a period of about five microseconds which serves to turn the light sensitive transistors 57–61 full on in a manner termed their switching mode of operation. Thereafter, the trailing edge of the turn-on pulse is greatly decreased in amplitude as shown in FIG. 5(*b*) but is sufficient to maintain the transistors 57 through 61 full on for a desired interval of conduction. Thereafter, upon cessation of the light impulse from either the LED 32 or 33 the corresponding light sensitive transistors turn off without requiring auxiliary commutating components as do the LASCR's, etc. This same intensity adjustment may also be useful with thyristors to insure best possible dynamic properties.

FIGS. 5(*a*) and 5(*b*) of the drawings illustrates still another form of proportional control alternating current power amplifier constructed in accordance with the invention. The power circuit shown in FIG. 6 is comprised by a proportionally controlled emitter portion formed by an injection and electroluminescent p-n junction light emitting diode 47 of the gallium phosphide type, for example. The light emitting diode 47 is connected in series circuit relationship with a triac, bilateral semiconductor triode 65 and a limiting resistor 66 across a source of alternating current which may comprise a conventional 60 cycle alternating current supply. As was explained in connection with FIG. 4 of the drawings, the gallium phosphide LED 47 is capable of emitting light of one wavelength $\lambda_1$ centered in the red region of the visible light spectrum when excited with a potential of one polarity, and emits light of a different wavelength $\lambda_2$ centered in the green portion of the visible spectrum when excited with an enabling potential of a different polarity in the reverse direction. The triac bilateral semiconductor triode 65 is an electrically gated, commercially available bidirectional conducting semiconductor which can be gated on to conduct current therethrough in either direction depending upon the polarity of the potential applied across its supply or load terminals. This device has been described more fully in the literature and particularly in the text book entitled "P-N-P-N Semiconductor Devices" by Gentry, Gutzwiler, Holynyak and Von Zastrow published by Prentice Hall, Inc., publishers—Englewood Cliffs, N.J. For a more complete description of the bilateral semiconductor triode 65, reference is made to this textbook.

Light emitted by the LED 47 is transmitted to a first receptor circuit comprised by a pair of LASCR's 67 and 68 which are designed to respond to light of wavelength $\lambda_1$ in the red portion of the visible spectrum, and green light of wavelength $\lambda_2$, respectively. The LASCR 67 is connected in series circuit relationship with a first blocking diode 69 across the alternating current supply terminals, and the LASCR 68 is connected in series circuit relationship with a blocking diode 71 in parallel with the first LASCR 67 and series connected blocking diode 69 across the alternating current supply potentials. A load 30 is connected between the juncture of the LASCR 67 and blocking diode 69 and the juncture of the LASCR 68 and blocking diode 71. For convenience in the following explanation the alternating current supply terminals will be labeled A and B.

In operation, the circuit of FIGS. 6(*a*) and 6(*b*), as thus far described, functions in the following manner. Assuming that at a given instant the terminal A is positive with respect to the terminal B, at this instant the triac 65 and LED 47 are enabled to conduct current through the LED 47 in a direction to emit red light. At an appropriate point in the phase of this cycle, which will be termed the positive half cycle, the triac 65 can be triggered on by an appropriate electrically operated, variable control signal connected to its control gate terminal. Upon the triac 65 being triggered on, the LED 47 will be rendered conductive to emit red light that is applied to the light sensitive junction of LASCR 67. Since concurrently with this action the anode of LASCR 67 is enabled by the alternating current supply potential, LASCR 67 breaks down and conducts and supplies load current to load 30 through the path comprising LASCR 67 and blocking diode 71. It will be appreciated that by so turning on the triac 65 at an appropriate point in the phase of each positive half cycle of the alternating current supply potential, the load current supplied through load 30 in this direction can be proportionally controlled. In a similar fashion, by turning on the triac 65 at an appropriate point in the phase of each negative half cycle of the alternating current supply (during which half cycle the LED 47 emits green light), load current flow through load 30 in the reverse direction can be controlled by LASCR 68 which supplies load current through load 30 in the reverse direction through blocking diode 69. If the load 30 is an alternating current load, the LASCR's 67 and 68 can be light activated during each alternate half cycle and by controlling the point in the phase of each alternate half cycle at which the LASCR's 67 and 68 turn on, proportional control of the A.C. load current supplied to load 30 can be achieved. Thus, it will be appreciated that the circuit of FIGS. 6(*a*) and 6(*b*) in actuality constitutes a universal control in that it is capable of proportional control of both direct current and alternating current flow supplied to the load 30.

Figure 6B:
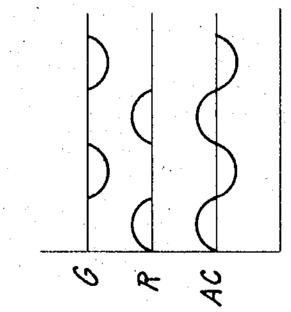
Figure 6A:
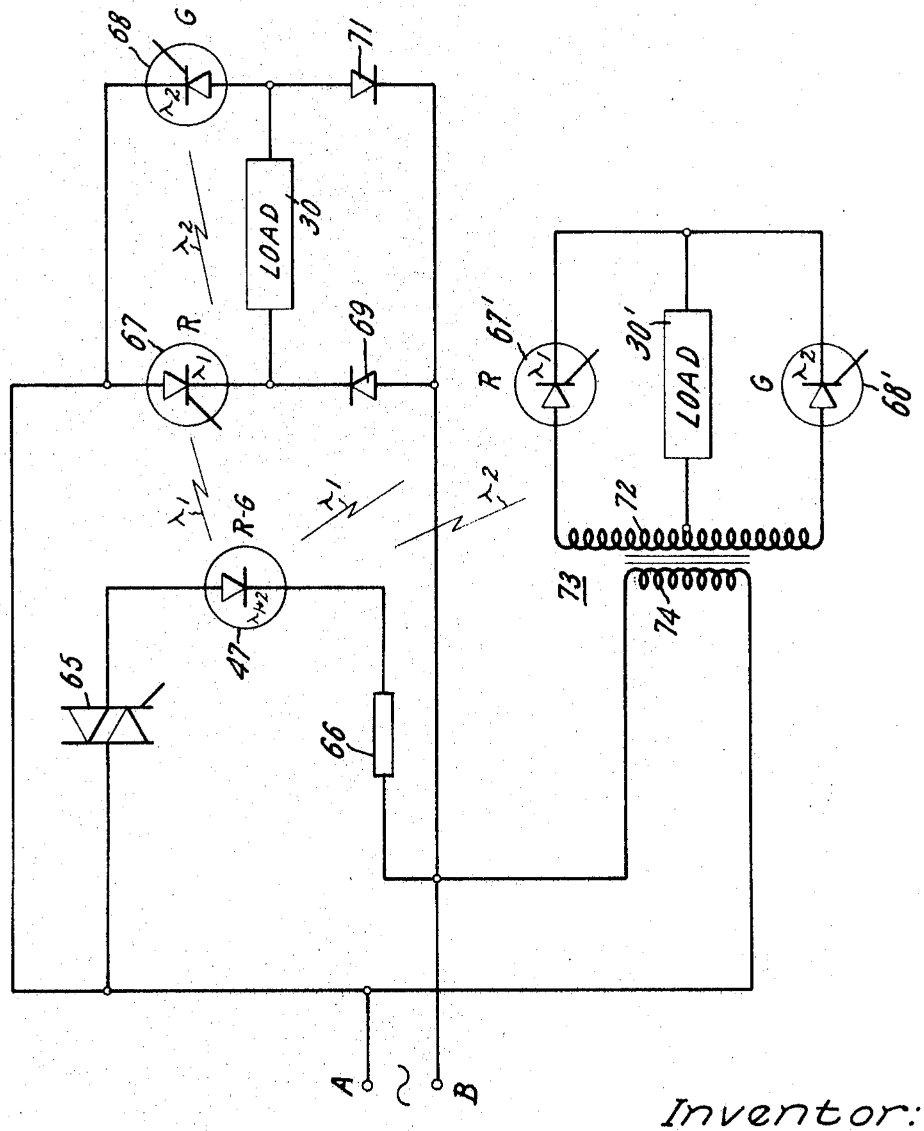

The circuit of FIGS. 6*a* and 6*b* as thus far described, while entirely satisfactory for many circuit applications, may be undesirable for other circuit applications in that there is no isolation provided between the signal level control circuit and the power level load circuit. Where such isolation is required, the second receptor circuit comprised by the LASCR 67′ and 68′ may be employed. In this circuit arrangement the LASCR 67′ is connected to one terminal of a secondary winding 72 of a coupling transformer 73 and the remaining LASCR 68′ is connected to the remaining free terminal of the secondary winding 72. The center tap point of the secondary winding 72 is connected to one terminal of the load 30′ while the remaining terminal of the load 30′ is connected in common to the cathodes of the two LASCR's 67′ and 68′. The primary winding 74 of coupling transformer 73 is supplied from the alternating current supply potential supplying the emitter circuit comprised by LED 47 and triac 65. By this arrangement it will be appreciated that the coupling transformer 73 provides isolation between the emitter circuit and the power level receptor circuit. Since the operation of the second receptor circuit is similar to the first receptor circuit a complete description of its operation is believed unnecessary. It may be well to point out, however, that at the time that the anode of the LASCR 67′ is enabled by the application of a positive enabling potential thereto, the emitter LED 47 is enabled to emit red light, while during the reverse half cycle the green responsive LASCR 68′ is enabled by the reversal in polarity of the potential supplied across coupling transformer 73. Thus, during alternate half cycles of the alternating current supply the LASCR'S 67′ and 68′ will proportionally control load current flow through the load 30′. Hence, it will be appreciated that the circuit of FIGS. 6(*a*) and 6(*b*) constitutes either a reversible, proportional direct current control, or a proportional alternating current control depending upon the controlling turn-on signals supplied to triac 65. FIG. 6(*b*) of the drawings illustrates the wave shape of the alternating current supply potential, the positive half cycle during which the LED 47 is enabled to emit red light, and the negative half cycle during which the LED 47 emits green light.

Figure 7:
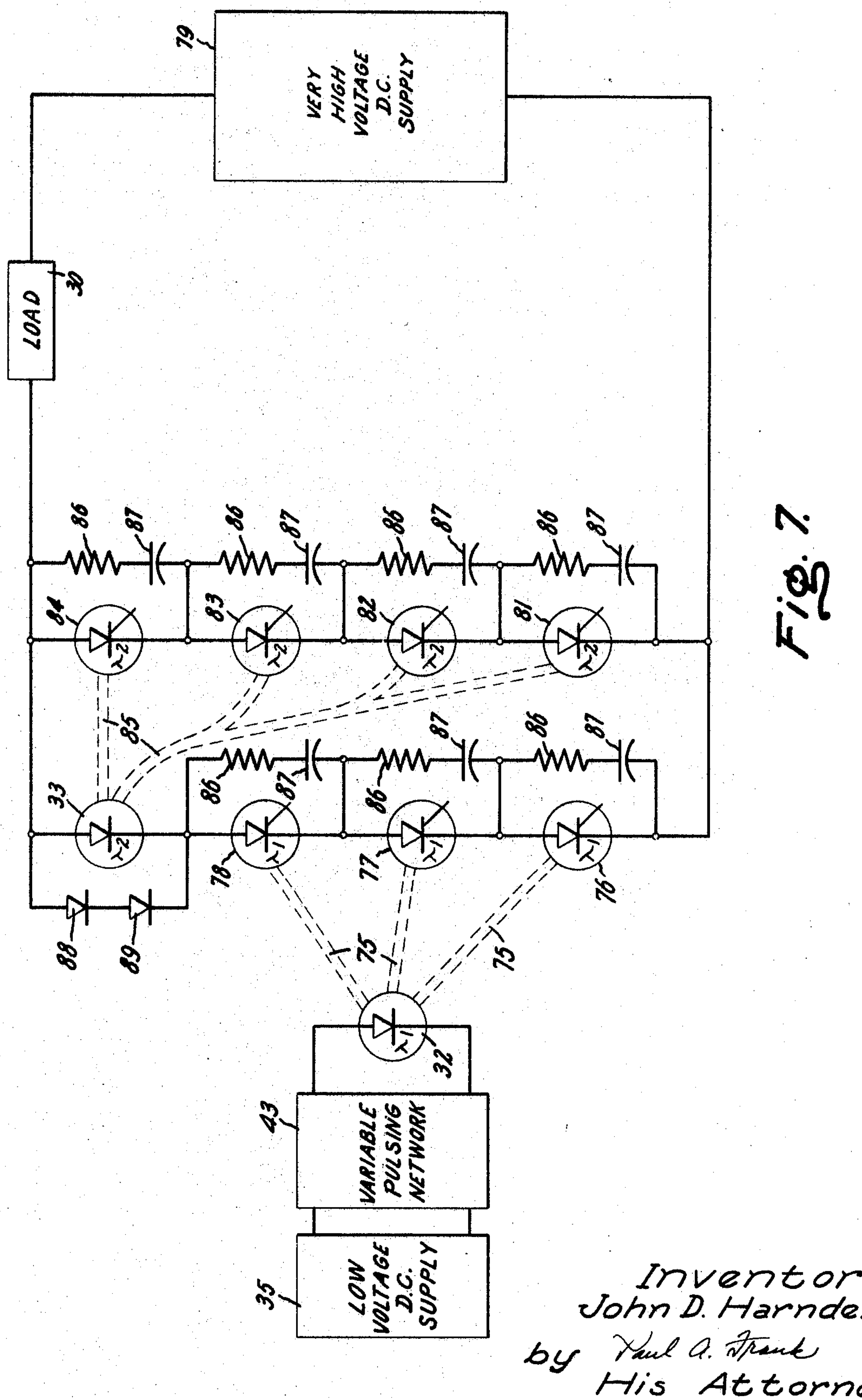

FIG. 7 of the drawings illustrates a light activated, high voltage circuit constructed in accordance with the principles of the present invention. In the high voltage circuit shown in FIG. 7, a light emitting diode 32 is controllably excited from a variable pulsing network 43 that is in turn supplied from a low voltage, direct current supply source 35. The light emitting diode 32 supplies light pulses over a plurality of fiber optic, light coupling elements 75 to the light sensitive junctions of a plurality of series connected LASCR's 76, 77 and 78. The LASCR's 76 through 78 are connected in series circuit relationship with a second LED 33 and a load 30 across a very high voltage, direct current, supply potential source 79. The LASCR's 76 through 78 may be especially selected, high cost devices having optimum dynamic response characteristics. That is to say that these devices have been specially fabricated to be extremely sensitive to light gating pulses and have high *di/dt* characteristics in that once they are subjected to a gating light pulse, they are triggered almost instantaneously into a fully conducting condition. The LASCR's 76–78 are connected in series circuit relationship with a second LED 33 which by design is capable of emitting light at a different frequency or wavelength than the light emitted by the first LED 32. The light emitted by the second LED 33 is transmitted to the light sensitive junction of a second string of series connected LASCR's 81 through 84 which are connected in series circuit relationship across the first series connected LASCR's 76 through 78 and LED 33. The second series connected LASCR's 81 through 84 may be regular, low cost, light sensitive LASCR's which are slaved by the action of the second LED 33 to provide almost instantaneously a parallel current path to that provided by the first LASCR's 76 through 78 and LED 33 for load current supplied to load 30. If necessary, additional parallel, series connected slaved strings of lower cost LASCR's may be added to achieve a desired current carrying capability. Similarly, if necessary, additional LASCR's may be added in each of the series strings to provide the necessary voltage capabilities for use with the various types of loads and very high voltage, direct current supply sources 79. The second LED 33 may transmit its light pulse directly to the light sensitive junction of the second series string of LASCR's 81 through 84 or may supply the same over suitable light coupling paths such as the fiber optic elements indicated at 85. It is also desired that the voltage sharing circuits shown at 86 and 87 be connected in parallel with each of the LASCR's in order to force proper voltage distribution under all operating conditions. Current dividing between strings can also be optimized by conventional circuit techniques. Additionally, in the circuit of FIG. 7, a pair of series connected conventional diodes 88 and 89 may be connected in a series string across the second LED 33 to act as a light output control and as a way to select the lowest level of current for which light output will result.

In operation, selectively applied control light pulses produced by the first LED 32 are transmitted over the light coupling paths 75 to the light sensitive junction of the first series connected LASCR's 76 through 78. As explained above, these devices may be high cost, extremely sensitive LASCR's, and hence, for certain circuit applications, the light path 75 may provide for remote location of the control light emitter 32. Such remote location of the control light emitter 32 is made possible by the higher sensitivity devices in the first string of LASCR's 76 through 78. Upon the first series string of LASCR's 76 through 78 being triggered-on, the second LED 33 will be triggered into conduction and produces a light pulse that almost simultaneously gates on the second string of LASCR's 81 through 84. This is because light from the combination of 33, 88, 89, etc. can function over a very wide dynamic range from a few milliamperes to hundreds of amperes .Because the second LED 33 may be physically juxtaposed to the second series string of LASCR's 81 through 84, the additional light coupling elements 85 may not be required, even where the second series connected LASCR's 81 through 84 are conventional, low cost, lower sensitivity devices. Thus, it will be appreciated that any necessary magnitude load current, as well as voltage capability can be designed into the circuit of FIG. 7. By proportionally controlling the turn-on time of the first LED 32, proportional load current flow through the load 30 can be achieved. Further improvement in the operation of the circuit can be realized by the provision of a suitable feedback optical coupling path between LED 33 and the LASCR's 76–78. By the provision of such feedback it will be assured that the LASCR's 76–78 remain turned full on where the controlling light from LED 32 is pulsed in nature. Further, such feedback will provide regenerative avalanching of the LASCR's 76–78 to assure complete and fast turn-on of these devices.

Figure 8A:
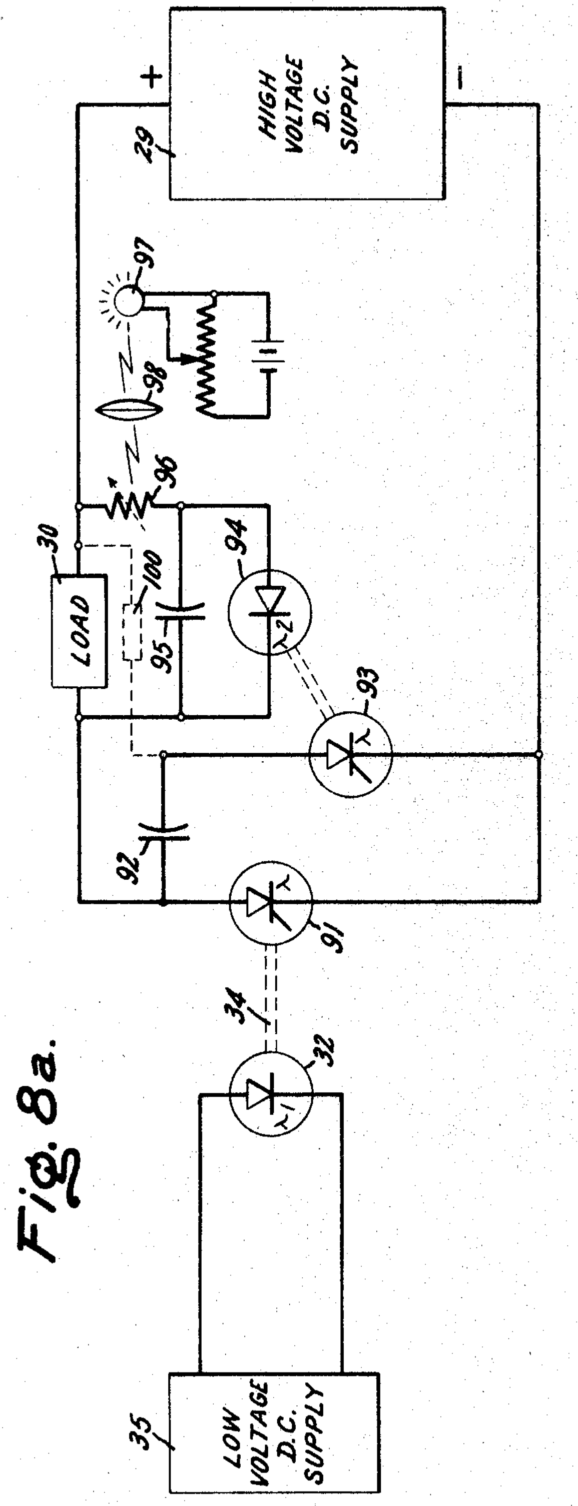
Figure 8B:
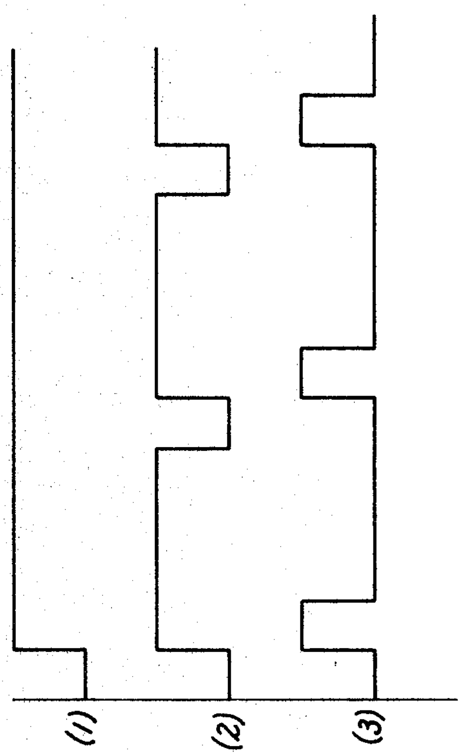

FIGS. 8(*a*) and 8(*b*) of the drawings illustrates a time ratio control power circuit incorporating the light gating features of the present invention and employing a new, light gated, commutation circuit for turning off the LASCR's after each conduction interval. The time ratio control power circuit shown in FIGS. 8(*a*) and 8(*b*) is comprised by an emitter portion including a light emitting diode 32 controlled from a low voltage source of direct current 35. The LED 32 preferably is of the type capable of continuous emission of light at room temperatures while operated at moderate voltages and currents. For example, the GAE–406 is an infrared emitting, gallium arsenide LED capable of emitting 40 milliwatts of continuous radiation at .92 micron. It is manufactured and sold by the Microelectronics Division of Philco Corporation, a subsidiary of Ford Motor Company, and could be used as the LED 32. The control light emitted by LED 32 is supplied through a suitable light coupling path 34 to the light sensitive junction of a main, load current carrying LASCR 91. The main LASCR 91 is connected in series circuit relationship with a load 30 across a high voltage direct current power supply 29. Thus, upon the application of gating-on light to the light sensitive juncture of the LASCR 91, the device will be rendered conductive and supply load current to the load 30.

The main LASCR 91 is commutated off by a commutating circuit comprised by a commutating capacitor 92 connected in series circuit relationship with a second or commutating LASCR 93 across the main LASCR 91. Commutating capacitor 92 is charged through a charging resistor 100. The commutating LASCR 93 is gated on by a second LED 94 which may be designed to emit light at a different wavelength than the first LED 32 and which is connected across a charging capacitor 95. The charging capacitor 95 and second LED 94 in turn are connected in parallel across load 30 by a light sensitive variable resistor 96, the photoresistivity of which is controlled from a variable intensity light source 97 whose light rays are directed onto the photoresistor 96 through a suitable lens assembly 98, if desired.

In operation, the plate of commutating capacitor 92 connected to the anode of the main LASCR 91 will be charged positively to the voltage of the supply source 29 through resistor 100. Thereafter upon main LASCR 91 being gated on by the application of a light signal to its light sensitive junction from LED 32, the voltage on the anode of the commutating LASCR 93 will go to about twice the supply voltage due to the charge on commutating capacitor 92. However, at this point the commutating LASCR is not conducting so that the charge on the commutating capacitor 92 is trapped. After a desired interval of conduction, in accordance with well known time ratio control principles, the charge on charging capacitor 95 builds up sufficiently to render the second LED 94 conductive. Upon this occurrence, the light emitted by the second LED 94 gates on the commutating LASCR 93. Upon the commutating LASCR 93 being turned on, the reverse polarity charge built up across capacitor 92 is applied back across the main LASCR 91 and causes it to be commutated off. Subsequent to this action the charge on the commutating capacitor becomes sufficiently dissipated to allow the commutating LASCR 93 to turn-off. Thereafter, the commutating capacitor is recharged through resistor 100 to condition the circuit for a new cycle of operation.

It will be appreciated from this explanation that one of the variables controlling operation of the circuit of FIGS. 8(*a*) and 8(*b*) is the timing of the point of conduction of the second commutating LED 94. This timing is controlled by the resistor-capacitor time constant of the charging capacitor 95 and the photoresistor 96. It is also believed apparent that this time constant can be controlled by controlling the intensity of the light source 97 thereby controlling the photoresistivity of the photoresistor 96. FIG. 8(*b*) of the drawings illustrates the characteristic wave shape appearing across load 30 for various settings of the light source 97 to provide various levels of radiation to the photosensitive resistor 96. Under conditions where no radiation is supplied to photoresistor 96 it exhibits infinite impedance so that the charging capacitor 95 never charges sufficiently to gate on the second LED 94. Consequently, the main LASCR 91 continues to conduct for an indefinite period as shown at 1. Curve 2 illustrates the operating characteristics obtained for approximately 50 percent radiation; and curve 3 illustrates the output current obtained for maximum radiation from light source 97. From an examination of FIG. 8(*b*) it will be appreciated that by controlling the intensity of the light source 97 the resulting output load current supplied to load 30 can be proportionally controlled from a maximum to a minimum value by merely controlling the commutation interval of the light coupled commutation circuit comprised by the elements 93, 94 and commutating capacitor 92.

Figure 9:
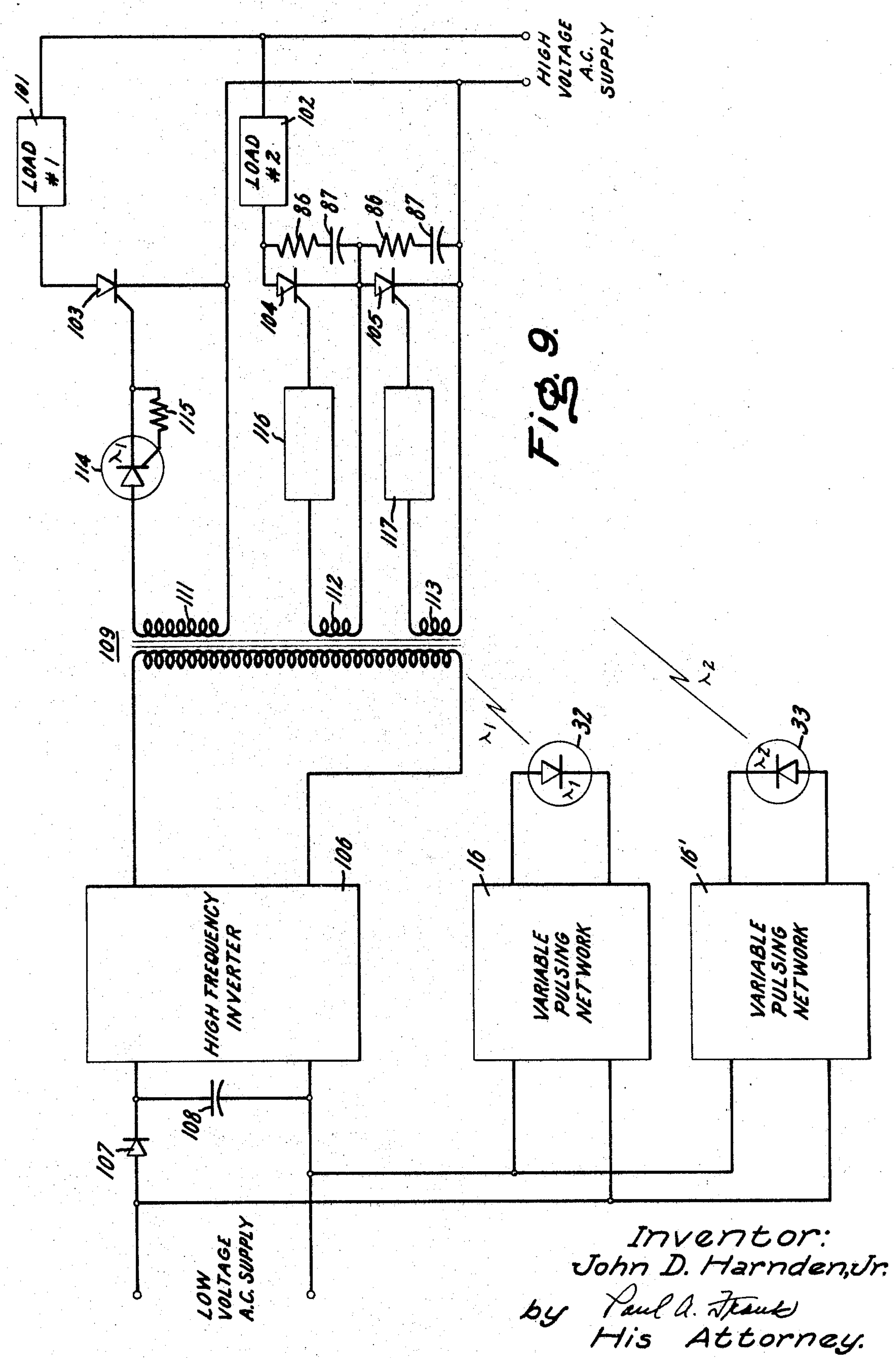
FIG. 9 is a schematic circuit diagram of a light activated, semiconductor power control circuit according to the invention wherein low power, light activated semiconductor devices are employed to gate on larger, power rated, electrically gated semiconductor power switching devices such as silicon controlled rectifiers.

FIG. 9 of the drawings illustrates an embodiment of the invention wherein light activated elements are employed to turn-on higher power, electrically gated, conventional SCR's to supply proportionally controlled load current through a load. In the circuit shown in FIG. 9, the emitter portions of the circuit are comprised by two light emitting diodes 32 and 33 designed to emit different wavelength light pulses in response to energization from respective variable pulsing networks 16 and 16′ energized from a common, low voltage, alternating current supply source.

The receptor portion of the circuit shown in FIG. 9 is designed to supply load current to two separate loads 101 and 102 from a high voltage, alternating current supply source. For this purpose the first load 101 is connected in series circuit relationship with a first, high power, gate controlled, conventional silicon controlled rectifier 103 across the alternating current supply source. The second load 102 is connected in series circuit relationship with two, series connected, gate controlled, conventional SCR's 104 and 105 across the high voltage alternating current supply source. It is, of course, understood that the loads 101 and 102 are connected in series with the load terminals of the SCR's 103 and 104, 105, respectively. To force load sharing between the two series connected SCR's 104 and 105, parallel connected, load sharing networks comprised by a resistor 86 and a series connected capacitor 87 are connected in parallel with each of the SCR's 104 and 105.

In order to gate on the main load current carrying conventional SCR's 103 through 105, a gating circuit arrangement is provided which is comprised by a high frequency inverter 106 supplied from a rectifying network consisting of a diode rectifier 107 and filter capacitor 108 connected across the low voltage AC supply. The output from the high frequency inverter 106 is supplied through a coupling transformer 109 having a plurality of secondary windings 111, 112, and 113. The secondary winding 111 is connected in series circuit relationship with the load terminals of an LASCR 114 with the series circuit thus comprised being connected across the control gate-cathode of the load current carrying, conventional, higher power SCR 103. To assure optimum turn-on of the LASCR 114, its control gate may be connected through a feedback resistor 115 to its cathode. In this manner, full turn-on of the LASCR 114 once it has been gated into conduction by the application of a light pulse to its light sensitive surface, is assured. The two secondary windings 112 and 113 similarly are connected in series circuit relationship with light sensitive elements 116 and 117 across the control gate-cathode of the conventional SCR's 104 and 105, respectively. The light sensitive elements 116 and 117 may comprise any of the light activated devices heretofore described such as an LASCR, a light activated triac, a light activated transistor, or one of the photoconductors discussed with relation to FIG. 4 of the drawings.

In operation, the high frequency inverter circuit 106 functions to develop across each of the secondary windings 111 a high frequency alternating current enabling potential that is applied across the load terminals of the light activated control elements such as LASCR 114, and devices 116 and 117. When it is desired to supply load current to the load 101, the variable pulsing network 16 is actuated so as to supply control gating on pulses to LED 32. Light pulses emitted by LED 32 are then directed against the light sensitive surface of the LASCR 114 and cause it to be gated on during one of the intervals while it is enabled by the alternating current potential developed across the secondary winding 111. The frequency of the high frequency inverter 106 is adjusted so that the interval of conduction provided for the LASCR 114 is adequate to supply sufficient turn-on current to the control gate of the higher power SCR 103. Thus, the higher power SCR 103 will be turned on and supply load current to load 101. Subsequently, as the high frequency current supplied from winding 111 decreases through its natural current zero, it will line commutate off the LASCR 114 rendering it susceptible for another interval of conduction. Similarly, the main load current carrying SCR 103 will be line commutated off by the high voltage alternating current supply going through its current zero. If desired, a conventional full wave rectifier network can be interposed in the circuit intermediate the secondary windings 111–113 and the LASCR's and thereby double the number of enabling periods.

It is believed obvious that the bidirectional conducting triac devices can be substituted for the devices 114 and 103 in the circuit arrangement of FIG. 9 to provide full wave control of the load current being supplied to load 101. It might also be noted that the portion of the circuit operated by the second light emitter 33 is entirely similar to that described above with relation to light emitter 32. Hence, it is not believed necessary to recite in detail the manner of operation of the series connected SCR's 104 and 105. This portion of the circuit has been included however merely to illustrate the manner in which a high voltage string could be arranged using any of the known, light sensitive actuating elements to turn-on conventional electrically gate controlled devices.

Figure 10:
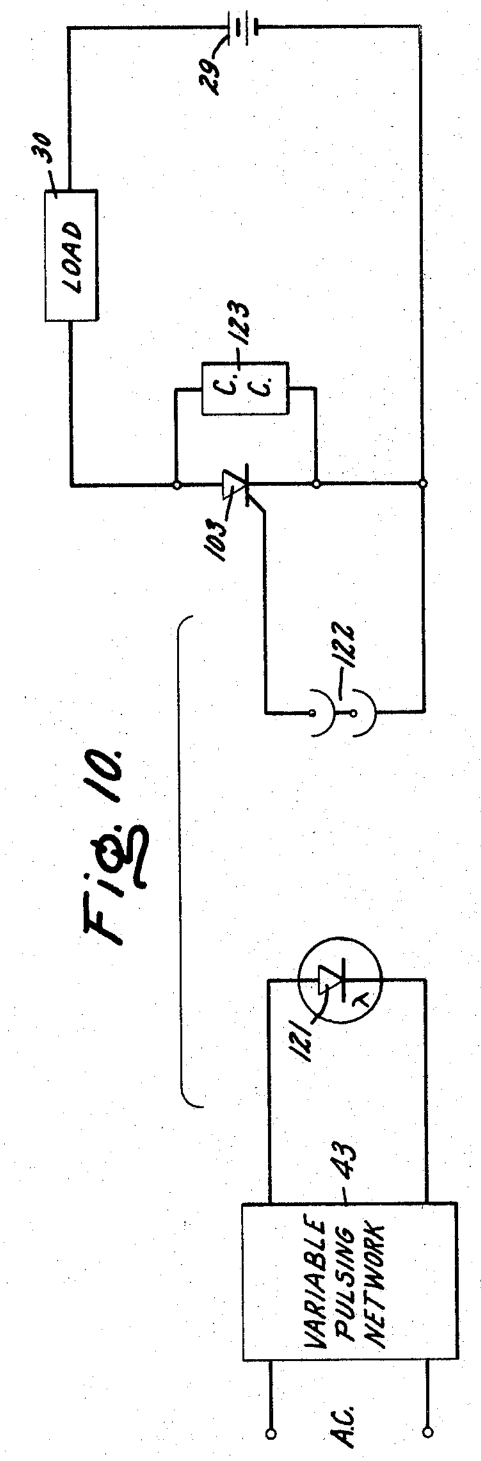
FIG. 10 is a schematic circuit diagram of a light controlled power circuit according to the invention wherein solar cells are employed as the light sensitive gating elements.

FIG. 10 of the drawings illustrates an embodiment of a light activated power circuit in accordance with the invention wherein solar cells are employed as the light receptor devices. In the circuit arrangement of FIG. 10, the variable pulse network 43 supplied from a low voltage alternating current supply source, is employed to excite a light emitting diode 121. The light emitting diode is a high power device, which in this case is capable of operating in the coherent mode. It is capable of supplying light pulses up to about 0.2 microseconds with each pulse producing at least 50 watts. This LED is capable of being operated at a frequency of about 1000 pulses per second. One suitable type is manufactured and sold by Radio Corporation of America, Harrison, N.J.

The high power light pulses produced by the LED 121 are directed to a solar cell array 122 which may comprise 8 to 10 individual solar cells connected in series circuit relationship. Such solar cell arrays are commercially available from such organizations as Solar Cells, Inc., of Skokie, Ill., Hoffman Electronics, and the International Rectifier Corporation of El Segundo, Calif. The solar cell array 122 is connected in the control gate-cathode of a power rated conventional silicon control rectifier 103. Silicon controlled rectifier 103 in turn is connected in series circuit relationship with a load 30 across a direct current source of potential 29 and has a commutating circuit 123 of conventional construction connected across it.

In operation, the variable pulse network 43 is employed to variably control the pulsed triggering of the high power LED 121. The high energy light pulses produced by the LED 121 are directed onto the solar cell array 122 to produce sufficiently large electrical gating pulses to cause the SCR 103 to be gated on at a rate determined by the rate of the high energy light gating pulses. Thereafter the circuit operates in a conventional time ratio control manner to control load current flow through the load 30. The commutating circuit shown at 123 is employed to commutate off the SCR 103 after each conduction interval.

Figure 11:
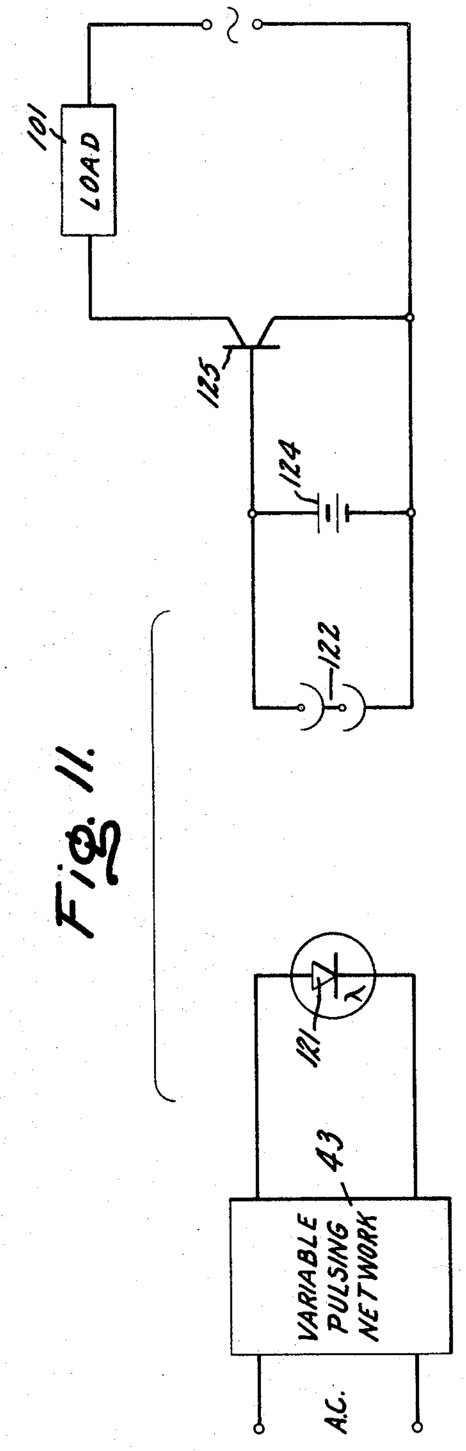
FIG. 11 is a circuit diagram of a modified form of the circuit shown in FIG. 10 wherein a nickel cadmium battery charged by solar cells are used.

FIG. 11 of the drawings illustrates a modification of the circuit shown in FIG. 10 wherein the solar cell array 122 is employed to maintain the charge on a nickel cadmium battery shown at 124. The nickel cadmium battery 124 then serves to apply a turning on potential to the base of a power transistor 125. The power transistor 125 is connected in series circuit relationship with an alternating current load 101 and a source of alternating current supply potential.

In operation, the circuit of FIG. 11 utilizes the high energy light pulses from the LED 121 to maintain the charge of the nickel cadmium battery 124 at a desired level determined by the desired load current flow to be supplied through the load 101. By refraining from supplying light pulses to the solar cells 122, the nickel cadmium battery 124 will discharge itself through transistor 125 sufficiently so that the transistor is allowed to turn off. By increasing the number of pulses supplied by LED 121 to the solar cell array 122 the charge on the nickel cadmium battery 124 is increased sufficiently to maintain the transistor 125 full on. By modulating the number of pulses supplied to the solar cell array, the conduction condition of the transistor 125 can be appropriately controlled to thereby control load current flow through the load 101.

From the foregoing description it can be appreciated that the present invention provides a family of new, light activated, semiconductor power control circuits using low voltage, injection electroluminescent p-n junction, light emitting diodes to control larger, power rated, light activated semiconductor devices connected in a variety of power circuit configurations. By reason of this construction, isolation between the low voltage control light signals and the larger, power rated, load currents flowing in the circuit, is inherently provided by the fundamental difference in the physical nature of the control light gating-on signals and the resultant, electric power load currents.

Having described several embodiments of new and improved light activated, semiconductor power control circuits constructed in accordance with the present invention, other modifications and variations of the invention will be suggested to those skilled in the art in the light of the above teachings. It is therefore to be understood that changes may be made in the particular embodiments of the invention described which are within the full intended scope of the invention as defined by the appended claims.

What I claim as new and desire to secure by Letters Patent of the United States is:

1. A light activated power semiconductor circuit including in combination at least two light activated semiconductors of the type having a light sensitive junction for triggering the device into conduction, said light activated semiconductors having different light response characteristics and being connected in a power circuit configuration, injection electroluminescent p-n junction device means for emitting light within at least two mutually exclusive characteristic portions of the visible and invisible optical spectrum, means for directing the emitted light within one characteristic portion of the spectrum from said injection electroluminescent p-n junction device means onto the light sensitive junction of one of said light activated semiconductors, means for directing the emitted light within another characteristic portion of the spectrum from said injection electroluminescent p-n junction device means onto the light sensitive junction of another light activated semiconductor, the light response characteristic of each light activated semiconductor being matched to the emitted light directed onto its light sensitive junction so as to be responsive thereto to be triggered into conduction and to be substantially non-responsive to emitted light within another characteristic portion of the spectrum, and variable control means for controlling the light emitted by said injection electroluminescent p-n junction device means for controlling turn-on of said light activated semiconductors, at least two of said light activated semiconductors being rendered conductive sequentially.

2. A circuit according to claim 1 wherein said injection electroluminescent p-n junction device means comprises two individual injection electroluminescent p-n junction devices each emitting light within one of the aforementioned characteristic portions of the invisible and visible optical spectrum.

3. A circuit according to claim 1 wherein said light activated semiconductors comprise light activated silicon controlled rectifiers, and wherein an enabling potential is operatively coupled across the load terminals of each light activated silicon controlled rectifier simultaneously with the application of emitted light to its light sensitive junction.

4. A circuit according to claim 1 wherein said variable control means comprises a variable pulsing network.

5. A light activated power semiconductor circuit including in combination at least one light activated semiconductor of the type having a light sensitive junction for triggering the device into conduction, at least one injection electroluminescent p-n junction device for emitting light within the portion of the spectrum to which the light activated semiconductor responds, means for directing light from said injection electroluminescent p-n junction device onto the light sensitive junction of said light activated semiconductor, and variable control means for controlling the light emitted by said injection electroluminescent p-n junction device for controlling turn-on of the light activated semiconductor, wherein there are a plurality of first type light activated semiconductors connected in series circuit relationship, said first type light activated semiconductors being responsive to light emitted by said first injection electroluminescent p-n junction device, a second injection electroluminescent p-n junction device connected in series circuit relationship with said series connected first type light activated semiconductors between a pair of high voltage power supply terminals, said first and second injection electroluminescent p-n junction devices emitting light within different characteristic portions of the visible and invisible optcal spectrum, and a pluralty of second type light activated semiconductors connected in series circuit relationship between said high voltage power supply terminals and being responsive to said second injection electroluminescent p-n junction device, said first and second type light activated semiconductors having different light sensitivity and *di/dt* characteristics.

6. A light activated power semiconductor circuit including in combination at least one light activated semiconductor of the type having a light sensitive junction for triggering the device into conduction, at least one injection electroluminescent p-n junction device for emitting light within the portion of the spectrum to which the light activated semiconductor responds, means for directing light from said injection electroluminescent p-n junction device onto the light sensitive junction of said light activated semiconductor, and variable control means for controlling the light emitted by said injection electroluminescent p-n junction device for controlling turn-on of the light activated semiconductor, wherein there are a plurality of first light activated semiconductors connected in series circuit relationship, said first light activated semiconductors having load sharing circuit means connected thereacross for forcing the semiconductors to share the load thereacross and being responsive to light pulses emitted by the injection electroluminescent p-n junction device, a second injection electroluminescent p-n junction device connected in series circuit relationship with the first series connected light activated semiconductors, said first and second injection electroluminescent p-n junction devices emitting light in different characteristic portions of the visible and invisible optical spectrum, and a plurality of second light activated semiconductors connected in series circuit relationship, the series connected second light activated semiconductors being connected in parallel circuit relationship with the series connected first light activated semiconductors and second injection electroluminescent p-n junction device and being responsive to the second injection electroluminescent p-n junction device, and second load sharing circuit means connected across said second light activated semiconductors to force load sharing.

7. A circuit according to claim 6 wherein the plurality of first light activated semiconductors are highly light sensitive, expensive devices, and the plurality of second light activated semiconductors are less sensitive, less expensive devices.

8. A circuit according to claim 6 wherein said first light activated semiconductors are light activated silicon controlled rectifiers, and wherein clamping diodes are connected in parallel circuit relationship with the second injection electroluminescent device for carrying the bulk of the current supplied through the string of series connected first light activated silicon controlled rectifiers.

References Cited

UNITED STATES PATENTS

| | | | |
|---|---|---|---|
| 3,355,600 | 11/1967 | Mapham | 307—311 X |
| 3,370,174 | 2/1968 | Toussaint | 307—278 |
| 3,413,480 | 11/1968 | Biard et al. | 250—217 X |
| 2,506,672 | 5/1950 | Kell et al. | 250—227 X |
| 3,386,027 | 5/1968 | Kilgore et al. | 321—11 |
| 2,081,839 | 5/1937 | Rankin | 250—239 X |
| 3,153,149 | 10/1964 | Finigian | 250—239 |
| 3,283,157 | 11/1966 | Blackmer | 250—239 X |
| 3,294,901 | 12/1966 | Stanghi | 250—239 X |
| 3,304,430 | 2/1967 | Biard et al. | 250—217 |
| 3,304,431 | 2/1967 | Biard et al. | 250—217 |
| 3,333,106 | 7/1967 | Fischer | 250—214 |
| 3,346,811 | 10/1967 | Perry et al. | 250—227 X |
| 3,370,174 | 2/1968 | Toussaint | 250—217 X |

OTHER REFERENCES

Moulton, C. H., "Light Pulse System Shrinks High-Voltage Protection Device," Electronics, May 17, 1965, vol. 38, No. 10, pp. 72–74.

WILLIAM F. LINDQUIST, Primary Examiner

T. N. GRIGSBY, Assistant Examiner

U.S. Cl. X.R.

250—214, 217, 227; 307—278, 284, 311